(12) United States Patent
Qi et al.

(10) Patent No.: US 10,591,782 B2
(45) Date of Patent: Mar. 17, 2020

(54) PIXEL STRUCTURE, DISPLAY PANEL AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhijian Qi, Beijing (CN); Heecheol Kim, Beijing (CN); Shaoru Li, Beijing (CN); Ni Yang, Beijing (CN); Yang He, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 98 days.

(21) Appl. No.: 15/689,426

(22) Filed: Aug. 29, 2017

(65) Prior Publication Data

US 2018/0149893 A1 May 31, 2018

(30) Foreign Application Priority Data

Nov. 30, 2016 (CN) .......................... 2016 1 1084244

(51) Int. Cl.
*G02F 1/1343* (2006.01)
*G02F 1/1362* (2006.01)
(Continued)

(52) U.S. Cl.
CPC ...... *G02F 1/1343* (2013.01); *G02F 1/136286* (2013.01); *H01L 27/12* (2013.01); *H01L 27/326* (2013.01); *H01L 27/3276* (2013.01)

(58) Field of Classification Search
CPC ............. H01L 27/124; G02F 1/136286; G02F 2201/40; G02F 1/134363; G02F 1/136213;
(Continued)

(56) References Cited

U.S. PATENT DOCUMENTS 9,017,572 B2   4/2015  Huh et al.
2005/0219436 A1  10/2005  Kwon et al.
(Continued)

FOREIGN PATENT DOCUMENTS

CN         1677206 A    10/2005
CN      101598877 A    12/2009
(Continued)

OTHER PUBLICATIONS

The First Chinese Office Action dated Mar. 5, 2019; Appln. No. 201611084244.8.
(Continued)

*Primary Examiner* — Huyen L Ngo
(74) *Attorney, Agent, or Firm* — Ladas & Parry LLP; Hermine Valizadeh

(57) ABSTRACT

A pixel structure, a display panel and a display device are provided. The pixel structure includes: a base substrate; a plurality of gate lines; a plurality of data lines; a plurality of pixel units, each includes a pixel electrode and a common electrode; and a common electrode line connected with the common electrode, wherein, the common electrode line includes a first part extended along the row direction and a second part extended along the column direction; the first part is electrically connected with the second part; both the first part and the second part are arranged in a same layer with the plurality of data lines; and a projection of the first part on the base substrate is at least partially disposed between projections of a gate line among the plurality of
(Continued)

gate lines which is closest to the first part and the pixel electrode on the base substrate.

14 Claims, 3 Drawing Sheets

(51) Int. Cl.
*H01L 27/12* (2006.01)
*H01L 27/32* (2006.01)

(58) Field of Classification Search
CPC ......... G02F 1/133512; G02F 1/136209; G02F 2001/134372; G02F 2001/134318; G06F 3/044; G09G 2300/0426; G09G 2300/0439
See application file for complete search history.

(56) References Cited

U.S. PATENT DOCUMENTS

| | | | | |
|---|---|---|---|---|
| 2014/0111749 A1* | 4/2014 | Won | ................ | G02F 1/136209 349/110 |
| 2014/0340622 A1* | 11/2014 | Ono | ................ | G02F 1/134363 349/138 |
| 2015/0001530 A1* | 1/2015 | Ishiga | ................ | H01L 27/127 257/43 |
| 2015/0179121 A1* | 6/2015 | Lee | ................ | G02F 1/136227 345/103 |
| 2015/0362809 A1 | 12/2015 | Wang et al. | | |
| 2017/0315414 A1 | 11/2017 | Wang et al. | | |
| 2018/0012907 A1 | 1/2018 | Cheng | | |
| 2018/0095334 A1* | 4/2018 | Zang | ................ | G02F 1/134309 |
| 2019/0051667 A1 | 2/2019 | Cai et al. | | |

FOREIGN PATENT DOCUMENTS

| | | |
|---|---|---|
| CN | 101989017 A | 3/2011 |
| CN | 102012580 A | 4/2011 |
| CN | 102109718 A | 6/2011 |
| CN | 103149754 A | 6/2013 |
| CN | 104076565 A | 10/2014 |
| CN | 104914640 A | 9/2015 |
| CN | 205139543 U | 4/2016 |
| CN | 106094363 A | 11/2016 |
| KR | 1020100008691 A1 | 1/2010 |
| KR | 20120055123 A | 5/2012 |

OTHER PUBLICATIONS

The Second Chinese Office Action dated Sep. 20, 2019; Appln. No. 201611084244.8.

The Third Chinese Office Action dated Jan. 20, 2020; Appln. No. 20161108424480.

* cited by examiner

PIXEL STRUCTURE, DISPLAY PANEL AND DISPLAY DEVICE

The application claims priority to the Chinese patent application No. 201611084244.8, filed Nov. 30, 2016, the present disclosure of which is incorporated herein by reference as part of the application.

TECHNICAL FIELD

Embodiments of the present disclosure relate to a pixel structure, a display panel and a display device.

BACKGROUND

With the continuous development of display technology, thin-film transistor liquid crystal displays (TFT-LCDs) have gradually become mainstream displays in the market. The TFT-LCD is to change the alignment of liquid crystal molecules by utilization of the change in the electric field intensity on a liquid crystal layer disposed between upper and lower substrates, and control the transmittance to display images.

A liquid crystal display (LCD) panel generally comprises a backlight module, a polarizer, an array substrate (a lower substrate), an counter substrate (an upper substrate), and a liquid crystal molecule layer filled in a cell formed by the upper and lower substrates. The array substrate includes pixel electrodes, common electrodes, gate lines and data lines. The on/off and the magnitude of voltage on the pixel electrodes are controlled by transversely arranged gate lines and longitudinally arranged data lines. The alignment of liquid crystal molecules is controlled by the change in the electric field intensity between the common electrodes and the pixel electrodes.

In addition, the array substrate may also adopt dual gate design, so as to effectively reduce the number of IC connectors of the data lines. Thus, the cost can be reduced.

SUMMARY

At least one embodiment of the present disclosure provides a pixel structure, including: a base substrate; a plurality of gate lines disposed on the base substrate and extended along a row direction; a plurality of data lines disposed on the base substrate and extended along a column direction; a plurality of pixel units, each includes a pixel electrode and a common electrode; and common electrode lines connected with the common electrodes, wherein, the common electrode line includes a first part extended along the row direction and a second part extended along the column direction; the first part is electrically connected with the second part; both the first part and the second part are arranged in a same layer with the date line; and a projection of the first part on the base substrate is at least partially disposed between projections of the gate line and the pixel electrode on the base substrate.

For example, in the pixel structure provided by an embodiment of the present disclosure, the projection of the first part on the base substrate is partially overlapped with the projection of the pixel electrode on the base substrate.

For example, in the pixel structure provided by an embodiment of the present disclosure, the projection of the first part on the base substrate is partially overlapped with the projection of the gate line on the base substrate.

For example, in the pixel structure provided by an embodiment of the present disclosure, two gate lines are disposed between the pixel units adjacent to each other along the column direction; and the pixel structure further includes: a black matrix, in which a projection of the black matrix on the base substrate is at least partially disposed between projections of the two gate lines on the base substrate.

For example, in the pixel structure provided by an embodiment of the present disclosure, the projection of the black matrix on the base substrate is partially overlapped with the projections of the two gate lines on the base substrate.

For example, in the pixel structure provided by an embodiment of the present disclosure, in the column direction, the black matrix is disposed between two edges on opposite sides of the two gate lines.

For example, in the pixel structure provided by an embodiment of the present disclosure, the data line and the second part are disposed between the pixel units adjacent to each other along the row direction; and the data lines and the second parts are alternately arranged in the row direction.

For example, in the pixel structure provided by an embodiment of the present disclosure, the pixel units are arranged in array along the row direction and the column direction; one gate line is disposed between the pixel units adjacent to each other along the column direction; and the pixel structure further comprises: a black matrix, with a projection on the base substrate at least partially disposed between projection of the gate line on the base substrate and projection of the pixel electrode disposed on a side of the gate line not provided with the first part, on the base substrate.

For example, in the pixel structure provided by an embodiment of the present disclosure, the projection of the black matrix on the base substrate is partially overlapped with the projection of the gate line on the base substrate.

For example, in the pixel structure provided by an embodiment of the present disclosure, the projection of the black matrix on the base substrate is partially overlapped with the projection of the pixel electrode, disposed on the side of the gate line not provided with the first part, on the base substrate.

For example, in the pixel structure provided by an embodiment of the present disclosure, the pixel electrodes and the common electrodes are transparent conductive electrodes.

For example, in the pixel structure provided by an embodiment of the present disclosure, the gate lines, the data lines and the common electrode lines are opaque metal wires.

At least one embodiment of the present disclosure provides a display panel, including any of the pixel structures described above.

At least one embodiment of the present disclosure provides a display device, comprising the display panel described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise specified, the technical terms or scientific terms used in the present disclosure have normal meanings understood by those skilled in the art. The words "first", "second" and the like used in the present disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

The TFT-LCD may adopt black matrix formed on a counter substrate to shield a non-display region, and hence avoids light leakage. The inventors of the application has noted that: in order to avoid light leakage as the black matrix cannot effectively shield the non-display region due to the width deviation and the coincidence deviation of layers, the cell-assembly deviation of the array substrate and the counter substrate, etc., the black matrix not only must shield the non-display region but also must shield a part of a display region. Therefore, within the shielding range of the black matrix, parts of the black matrix overlapped with the display region are assembly margin; if the assembly margin is designed to be relative small, the black matrix may be impossible to completely shield the entire non-display region, so as to result in the problems such as light leakage, reduced contrast and nonuniform dark state; and if the assembly margin is designed to be relative large, the problems such as reduced aperture opening ratio, reduced brightness and increased power consumption will occur.

Figure 1:
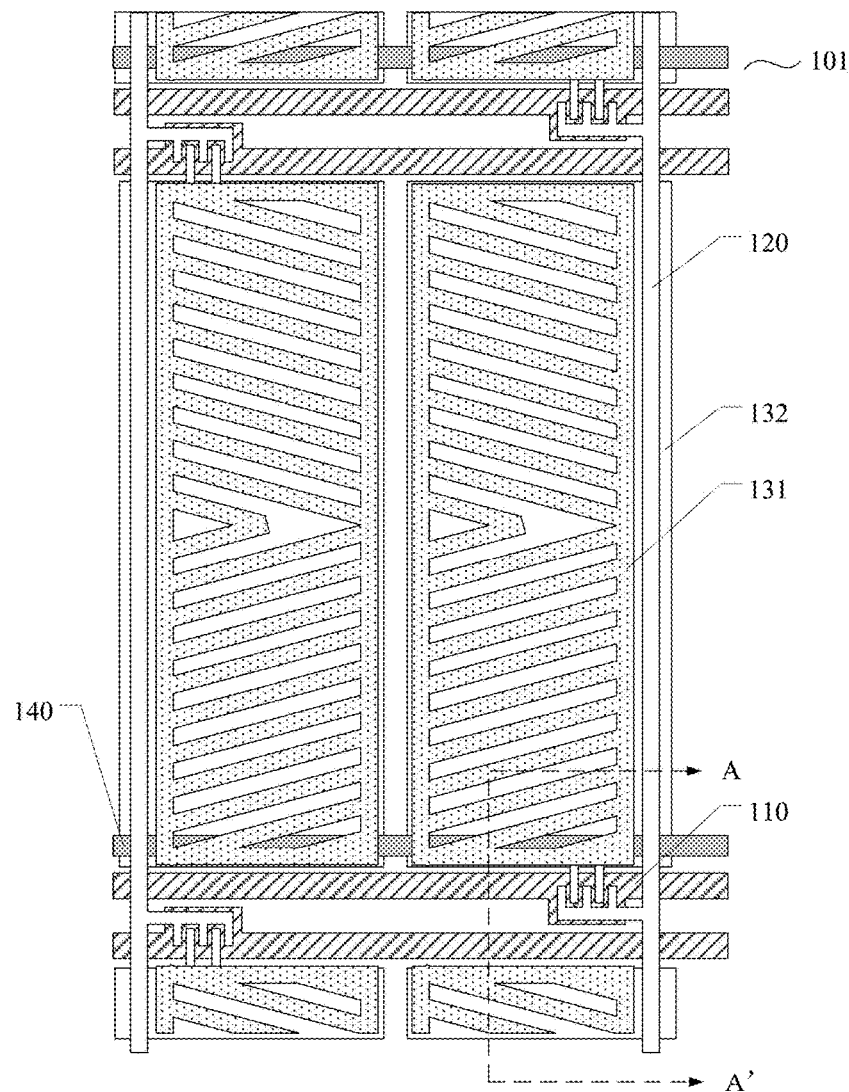
FIG. 1 is a schematic plan view of a pixel structure.
Figure 2:
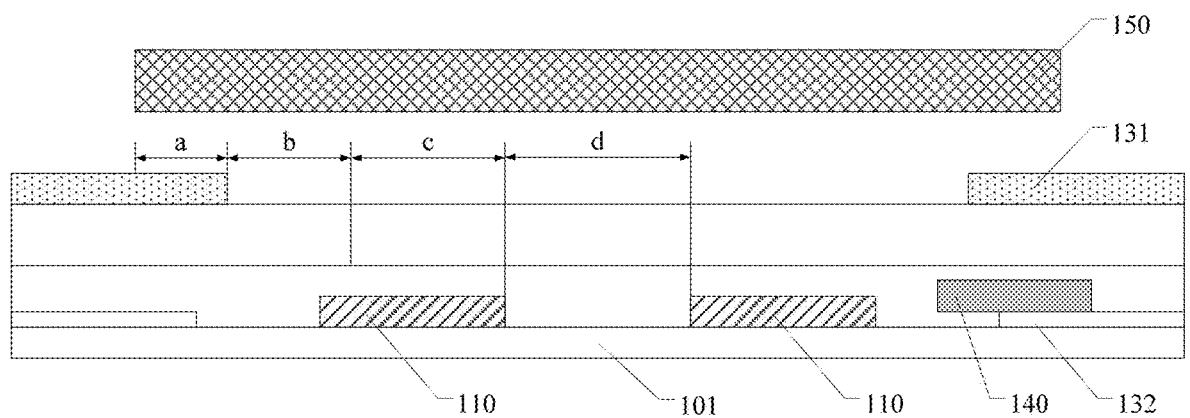
FIG. 2 is a schematic sectional view along the A-A' direction in FIG. 1.

FIG. 1 is a schematic plan view of a pixel structure. As illustrated in FIG. 1, the pixel structure includes gate lines 110, data lines 120, pixel electrodes 131, common electrodes 132 and common electrode lines 140. The common electrode lines 140 are extended along the row direction, electrically connected with the common electrodes 132, and configured to provide common voltage for the common electrodes 132. FIG. 2 is a schematic sectional view along the A-A' direction in FIG. 1. As shown in FIG. 2, the common electrodes 132 and the gate lines 110 may be arranged in the same layer on the base substrate 101; and the common electrode lines 140 are also arranged in the same layer with the gate lines 110 and lapped over the common electrodes 132. In order to avoid light leakage as the black matrix cannot effectively shield the non-display region due to the width deviation, the coincidence deviation of the layers, and the cell-assembly deviation of the array substrate and the counter substrate, etc., the black matrix 150 not only cover the gate electrodes 110 but also partial cover pixel electrodes 131. Therefore, the aperture opening ratio of the pixel structure is relative low.

Embodiments of the present disclosure provide a pixel structure, a display panel and a display device. The pixel structure includes a base substrate, a plurality of gate lines, a plurality of data lines, a plurality of pixel units and common electrode lines. The plurality of gate lines are disposed on the base substrate and extended along the row direction; the plurality of data lines are disposed on the base substrate and extended along the column direction; each pixel unit includes a pixel electrode and a common electrode; and the common electrode lines are connected with the common electrodes. The common electrode line includes a first part extended along the row direction and a second part extended along the column direction; the first part is electrically connected with the second part; both the first part and the second part are arranged in the same layer with the data line; and a projection of the first part on the base substrate is at least partially disposed between projections of the gate line and the pixel electrode on the base substrate. Thus, on one hand, in the pixel structure, because the first part and the second part of the common electrode line are arranged in the same layer with the data line, the first part and the second part can be electrically connected without a bridge structure or a through hole structure, thus simplifying the process, reducing the overall resistance of the common electrode lines, and alleviating the greenish phenomenon. On the other hand, in the pixel structure, because the projection of the first part on the base substrate is at least partially disposed between the projections of the gate line and the pixel electrode on the base substrate, the first part may be utilized to shield light, thus reducing the width of black matrix and improving the aperture opening ratio.

Description will be given below to the pixel structure, the display panel and the display device, provided by the embodiment of the present disclosure, with reference to the accompanying drawings.

First Embodiment

Figure 3:
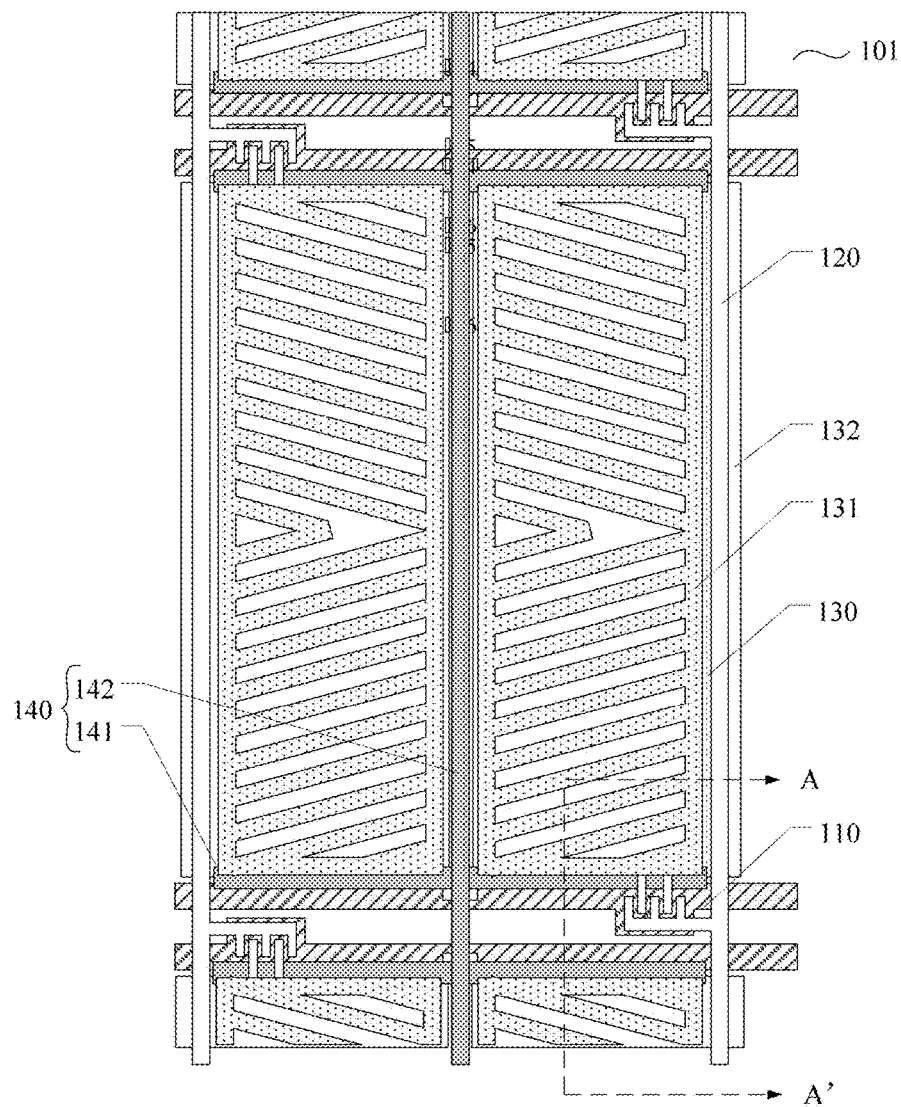
FIG. 3 is a schematic plan view of a pixel structure provided by an embodiment of the present disclosure.
Figure 4:
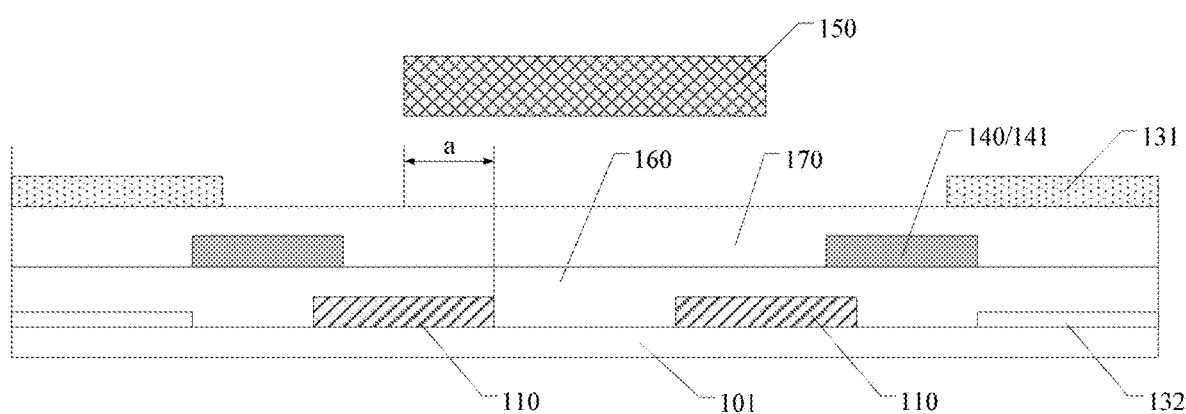
FIG. 4 is a schematic sectional view of the pixel structure provided by an embodiment of the present disclosure, along the A-A' direction in FIG. 3.

The embodiment provides a pixel structure. As illustrated in FIG. 3, the pixel structure comprises a base substrate 101, a plurality of gate lines 110, a plurality of data lines 120, a plurality of pixel units 130 and common electrode lines 140. The base substrate 101 may be a glass substrate, a quartz substrate, a plastic substrate or other substrates; the plurality of gate lines 110 are disposed on the base substrate 101 and extended along the row direction; the plurality of data lines 120 are disposed on the base substrate 101 and extended along the column direction; each pixel unit 130 includes a pixel electrode 131 and a common electrode 132; and the common electrode lines 140 are connected with the common electrodes 132. The common electrode line 140 includes a first part 141 extended along the row direction and a second part 142 extended along the column direction; the first part 141 is electrically connected with the second part 142; and both the first part 141 and the second part 142 are arranged in the same layer with the data line 120. As shown in FIG. 4, a projection of the first part 141 on the base substrate 101 is at least partially disposed between projections of the gate line 110 and the pixel electrode 131 on the base substrate 101. It should be noted that: as the first part is arranged in the same layer with the data line and extended along the row direction, the first part is disposed between two adjacent data lines. For example, the adjacent first parts are not connected by a bridge structure.

In the pixel structure provided by the embodiment, the first part and the second part of the common electrode line are arranged in the same layer with the data line, the first part and the second part may be electrically connected without a bridge structure or a through hole structure, therefore the process can be simplified, the overall resistance of the common electrode line can be reduced, and the greenish phenomenon can be alleviated; the projection of the first part on the base substrate is at least partially disposed between the projections of the gate line and the pixel electrode on the base substrate, therefore the first part may be utilized to shield light, the design width of black matrix can be reduced, and the aperture opening ratio can be improved.

For instance, in the pixel structure provided by an example of the embodiment, as shown in FIG. 4, the projection of the first part 141 on the base substrate 101 is partially overlapped with the projection of the pixel electrode 131 on the base substrate 101. Thus, the first part 141 can cover a part of the pixel electrode 131, so as to further avoid the light leakage phenomenon. In this case, the black matrix is not required to be designed to cover the pixel electrodes, so the design width of the black matrix can be reduced, and hence the aperture opening ratio can be improved. Of course, the embodiment of the present disclosure includes but not limited thereto. The projection of the first part on the base substrate may be connected with the projection of the pixel electrode on the base substrate. For example, a part of an edge of the projection of the first part on the base substrate can coincide with a part of an edge of the projection of the pixel electrode on the base substrate.

For instance, in the pixel structure provided by an example of the embodiment, as shown in FIG. 4, the projection of the first part 141 on the base substrate 101 is partially overlapped with the projection of the gate line 110 on the base substrate 101. Thus, the first part 141 may cover a part of the gate line 110, so as to further avoid the light leakage phenomenon. In this case, areas between the gate electrodes and the pixel electrodes are shielded by the first parts 141, without arranging a black matrix, so the design width of the black matrix can be reduced, and hence the aperture opening ratio can be improved. Of course, the embodiment of the present disclosure includes but not limited thereto. The projection of the first part on the base substrate may be connected with the projection of the gate line on the base substrate. For example, a part of an edge of the projection of the first part on the base substrate can coincide with a part of an edge of the projection of the gate line on the base substrate.

For instance, the pixel electrodes and the common electrodes are transparent conductive electrodes. For instance, the pixel electrodes and the common electrodes may be made from transparent oxide, e.g., a combination or at least one of indium tin oxide (ITO), indium zinc oxide (IZO), zinc oxide (ZnO), indium oxide (In2O3), indium gallium oxide (IGO) or aluminum zinc oxide (AZO). No limitation will be given here in the embodiment of the present disclosure.

For instance, the gate lines, the data lines and the common electrode lines are opaque metal wires. For instance, the materials of the gate lines, the data lines and the common electrode lines may adopt at least one selected from group consisting of copper (Cu), aluminum (Al), tungsten (W), titanium (Ti) and cobalt (Co) or an alloy of at least two thereof. No limitation will be given here in the embodiment of the present disclosure.

For instance, in the pixel structure provided by an example of the embodiment, as shown in FIGS. 3 and 4, the pixel units 130 are arranged in array along the row direction and the column direction; two gate lines 110 are disposed between the pixel units 130 adjacent to each other in the column direction; and the pixel structure further includes a black matrix 150. As shown in FIG. 4, a projection of the black matrix 150 on the base substrate 101 is at least partially disposed between projections of the two gate lines 110 on the base substrate 101. Thus, the black matrix can shield an area between the two gate lines, so as to avoid light leakage. Meanwhile, compared to the conventional pixel structure, as the width of the black matrix in the pixel structure is small, the pixel structure has higher aperture opening ratio on the premise of ensuring the avoidance of light leakage, and has lower power consumption on the premise of achieving same brightness.

For instance, in the column direction, the black matrix 150 is disposed between two edges on opposite sides of the two gate lines 110.

For instance, in the pixel structure provided by an example of the embodiment, as shown in FIG. 4, the projection of the black matrix 150 on the base substrate 101 is partially overlapped with the projections of the two gate lines 110 on the base substrate 101. In order to avoid light leakage as the black matrix cannot effectively shield the non-display region due to the width deviation and the coincidence deviation of layers, the cell-assembly deviation of the array substrate and the counter substrate, etc., the projection of the black matrix 150 on the base substrate 101 partially overlapped with the projections of the two gate lines 110 on the base substrate 101 can provide certain margin for assembly, so as to effectively avoid the light leakage phenomenon within certain assembly error range. In addition, as shown in FIG. 2, supposing that the black matrix 150 is required to partially overlap with the pixel electrode 131 with an assembly margin a, in order to ensure that the light leakage phenomenon can be effectively avoided within certain assembly error range, in this case, the width of the black matrix 150 is d+2(a+b+c). As shown in FIG. 4, the width of the black matrix 150 is d+2a on the premise of ensuring the same assembly margin a. At this point, the width of the black matrix 150 is reduced by 2(b+c), so the aperture opening ratio of the pixel structure can be improved. In addition, as the first part 141 shields an area between the gate line and the pixel electrode, the assembly margin of the black matrix 150 can be a+b+c, so as to effectively avoid the light leakage phenomenon and increase the contrast.

For instance, in the pixel structure provided by an example of the embodiment, as shown in FIGS. 3 and 4, the data line 120 and the second part 142 are disposed between the pixel units 130 adjacent to each other in the row direction; and the data lines 120 and the second parts 142 are alternately arranged in the row direction. That is, the second part 142 of the common electrode line is disposed between two adjacent data lines 120. For instance, as shown in FIGS. 3 and 4, the first part 141 is extended along the row direction and arranged between two adjacent data lines 120. For instance, both ends of the first part 141 are respectively arranged near the two adjacent data lines 120 but not in contact with the data lines 120.

Second Embodiment

Figure 5:
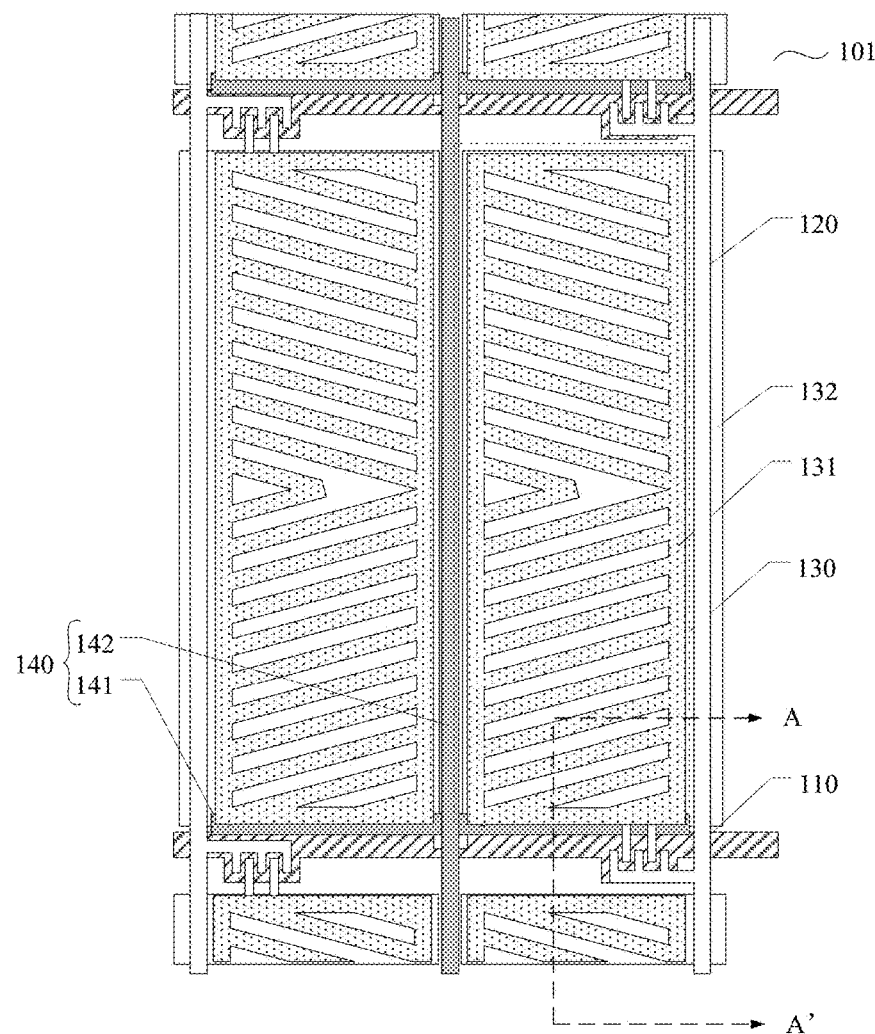
FIG. 5 is a schematic plan view of another pixel structure provided by an embodiment of the present disclosure.
Figure 6:
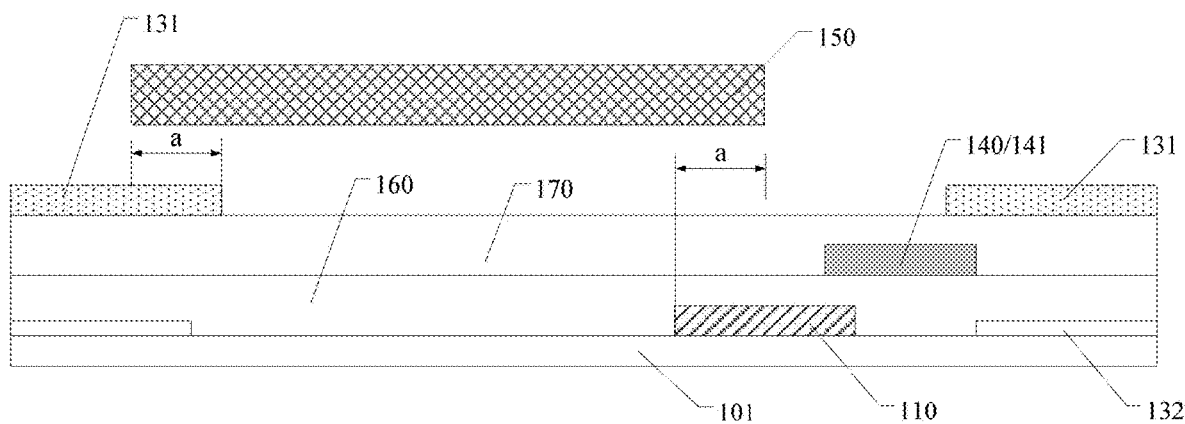
FIG. 6 is a schematic sectional view of another pixel structure provided by an embodiment of the present disclosure, along the A-A' direction in FIG. 5.

On the basis of the first embodiment, the embodiment provides a pixel structure. The differences between the embodiment and the first embodiment are that: in the pixel structure provided by the embodiment, as shown in FIG. 5, the pixel units 130 are arranged in array along the row direction and the column direction; one gate line 110 is disposed between the pixel units 130 adjacent to each other in the column direction; and the pixel structure further includes a black matrix 150. As shown in FIG. 6, a projection of the black matrix 150 on the base substrate 101 is at least partially disposed between projections of the gate line 110 and the pixel electrode 131, disposed on a side of the gate line 110 not provided with the first part 141, on the base substrate 101.

In the pixel structure provided by the embodiment, as shown in FIGS. 5 and 6, the projection of the black matrix 150 on the base substrate 101 is at least partially disposed between the projection of the gate line 110 on the base substrate 101 and the projection of the pixel electrode 131, disposed on the side of the gate line 110 not provided with the first part 141, on the base substrate 101. Thus, the black matrix can shield a light transmitting area between two adjacent pixel units 130, and hence avoid light leakage. Meanwhile, compared to the conventional pixel structure, the width of the black matrix in the pixel structure is small, so the pixel structure has higher aperture opening ratio on the premise of ensuring the avoidance of light leakage, and has lower power consumption on the premise of achieving the same brightness.

For instance, in the pixel structure provided by an example of the embodiment, as shown in FIGS. 5 and 6, the projection of the black matrix 150 on the base substrate 101 is partially overlapped with the projection of the gate line 110 on the base substrate 101. In order to avoid light leakage as the black matrix cannot effectively shield the non-display region due to the width deviation and the coincidence deviation of layers, the cell-assembly deviation of the array substrate and the counter substrate, etc., the part of the projection of the black matrix 150 on the base substrate 101, overlapped with the projection of the gate line 110 on the base substrate 101, can provide certain margin for assembly, so as to effectively avoid the light leakage phenomenon within certain assembly error range.

For instance, in the pixel structure provided by an example of the embodiment, as shown in FIGS. 5 and 6, the projection of the black matrix 150 on the base substrate 101 is partially overlapped with the projection of the pixel electrode 131, disposed on a side of the gate line 110 not provided with the first part 141, on the base substrate 101. In order to avoid light leakage as the black matrix cannot effectively shield the non-display region due to the width deviation and the coincidence deviation of layers, the cell-assembly deviation of the array substrate and the counter substrate, etc., the part of the projection of the black matrix 150 on the base substrate 101, overlapped with the projection of the pixel electrode 131, disposed on a side of the gate line 110 not provided with the first part 141, on the base substrate 101 can provide certain margin for assembly, so as to effectively avoid the light leakage phenomenon within certain assembly error range.

For instance, as shown in FIG. 2, supposing that the black matrix 150 is required to partially overlap with the pixel electrode 131 with an assembly margin a, in order to ensure that the light leakage phenomenon can be effectively avoided within certain assembly error range, in this case, the width of the black matrix 150 is d+2(a+b+c). As shown in FIG. 6, the width of the black matrix 150 is d+2a+b+c on the premise of ensuring same assembly margin a. At this point, the width of the black matrix 150 is reduced by b+c, so as to improve the aperture opening ratio of the pixel structure.

Third Embodiment

The embodiment provides a display panel, which comprises the pixel structure provided by any one of the first embodiment and the second embodiment. In the display panel provided by the embodiment, as both the first part and the second part of the common electrode line are arranged in the same layer with the data line, the first part and the second part may be electrically connected without a bridge structure or a through hole structure, so the process can be simplified, the overall resistance of the common electrode lines can be reduced, and the greenish phenomenon can be alleviated; and as the projection of the first part on the base substrate is at least partially disposed between the projections of the gate line and the pixel electrode on the base substrate, the first part may be utilized to shield light, so the design width of the black matrix can be reduced, and hence the aperture opening ratio can be improved.

For instance, the display panel may be an LCD panel. The embodiment of the present disclosure includes but not limited thereto.

For instance, as shown in FIGS. 4 and 6, the display panel can further include a first insulating layer 160 for covering the gate lines 120 and the common electrode lines 132, and a second insulating layer 170 for covering the second parts 142 of the common electrode lines 140. For instance, the first insulating layer 160 may be a gate insulating layer, and the second insulating layer 170 may be a passivation layer.

For instance, the material of the first insulating layer may adopt inorganic materials or organic materials. The inorganic materials may include one or more selected from silicon nitride (SiNx), silicon oxide (SiOx) and silicon oxynitride (SiNxOy). The organic materials can include acrylic resin or polyimide resin.

For instance, the material of the second insulating layer can adopt inorganic materials or organic materials. The inorganic materials may include one or more selected from SiNx, SiOx and SiNxOy. The organic materials may include acrylic resin or polyimide resin.

Fourth Embodiment

The embodiment provides a display device, which comprises the display panel provided by any one of the third embodiment. In the display device provided by the embodiment, as both the first part and the second part of the common electrode line are arranged in the same layer with the data line, the first part and the second part can be electrically connected without a bridge structure or a through hole structure, so the process can be simplify, the overall resistance of the common electrode lines can be reduced, and the greenish phenomenon can be alleviated; and as the projection of the first part on the base substrate is at least partially disposed between the projections of the gate line and the pixel electrode on the base substrate, the first part may be utilized to shield light, so the design width of the black matrix can be reduced, and hence the aperture opening ratio can be improved.

It should be noted that description is given in the embodiment of the present disclosure by taking advanced super dimension switch (ADS) mode or high aperture advanced super dimensional switching (HADS) mode as an example, but not limited thereto. For instance, the embodiment can also be applicable to in-plane switching (IPS) mode, etc.

In addition, description is given in the embodiments of the present disclosure by taking linear common electrode lines extended along the column direction as an example, but not limited thereto. For instance, the common electrode lines may also be not of a straight line, as long as the first parts of the common electrode lines are substantially extended along the row direction and the second parts are substantially extended along the column direction.

The following points should be noted:

(1) The accompanying drawings in the embodiments of the present disclosure only involve structures relevant to the embodiments of the present disclosure, and other structures can refer to the common design.

(2) For clarity, in the accompanying drawings of the embodiments of the present disclosure, the thickness and the size of layers or microstructures are enlarged. It should be understood that: when an element such as a layer, a film, a region or a substrate is referred to as being disposed "on" or "beneath" another element, the element may be "directly" disposed "on" or "beneath" another element, or an intermediate element may be provided.

(3) The characteristics in the same embodiment or different embodiments of the present disclosure can be mutually combined without conflict.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

What is claimed is:

1. A pixel structure, comprising:
a base substrate;
a plurality of gate lines disposed on the base substrate and extended along a row direction;
a plurality of data lines disposed on the base substrate and extended along a column direction;
a plurality of pixel units, each includes a pixel electrode and a common electrode; and
a common electrode line connected with the common electrode,
wherein, the common electrode line includes a first part extended along the row direction and a second part extended along the column direction; the first part is electrically connected with the second part; both the first part and the second part are arranged in a same layer with the plurality of data lines; and a projection of the first part on the base substrate is at least partially disposed between projections of a gate line among the plurality of gate lines which is closest to the first part and the pixel electrode on the base substrate.

2. The pixel structure according to claim 1, wherein the projection of the first part on the base substrate is partially overlapped with the projection of the pixel electrode on the base substrate.

3. The pixel structure according to claim 1, wherein the projection of the first part on the base substrate is partially overlapped with the projection of the gate line among the plurality of gate lines which is closest to the first part on the base substrate.

4. The pixel structure according to claim 1, wherein two gate lines are disposed between the pixel units adjacent to each other along the column direction; and the pixel structure further comprises:
a black matrix, in which a projection of the black matrix on the base substrate is at least partially disposed between projections of the two gate lines on the base substrate.

5. The pixel structure according to claim 4, wherein the projection of the black matrix on the base substrate is partially overlapped with the projections of the two gate lines on the base substrate.

6. The pixel structure according to claim 5, wherein in the column direction, the black matrix is disposed between two edges on opposite sides of the two gate lines.

7. The pixel structure according to claim 1, wherein each of the plurality of data line is disposed between the pixel units adjacent to each other along the row direction; the second part is disposed between the pixel units adjacent to each other along the row direction; and each of the plurality of data lines and the second part are alternately arranged in the row direction.

8. The pixel structure according to claim 1, wherein the pixel units are arranged in array along the row direction and the column direction; one gate line is disposed between the pixel units adjacent to each other along the column direction; and the pixel structure further comprises:
a black matrix, with a projection on the base substrate at least partially disposed between projection of the gate line on the base substrate and projection of the pixel electrode disposed on a side of the gate line not provided with the first part, on the base substrate.

9. The pixel structure according to claim 8, wherein the projection of the black matrix on the base substrate is partially overlapped with the projection of the gate line on the base substrate.

10. The pixel structure according to claim 8, wherein the projection of the black matrix on the base substrate is partially overlapped with the projection of the pixel electrode, disposed on the side of the gate line not provided with the first part, on the base substrate.

11. The pixel structure according to claim 1, wherein the pixel electrodes and the common electrodes are transparent conductive electrodes.

12. The pixel structure according to claim 1, wherein the gate lines, the data lines and the common electrode line is an opaque metal wire.

13. A display panel, comprising the pixel structure according to claim 1.

14. A display device, comprising the display panel according to claim 13.

* * * * *